(12) United States Patent
Onuki

(10) Patent No.: US 11,271,022 B2
(45) Date of Patent: Mar. 8, 2022

(54) IMAGING DEVICE, METHOD OF MANUFACTURING THE SAME, AND CAMERA

(71) Applicant: CANON KABUSHIKI KAISHA, Tokyo (JP)

(72) Inventor: Yusuke Onuki, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 6 days.

(21) Appl. No.: 16/550,484

(22) Filed: Aug. 26, 2019

(65) Prior Publication Data

US 2020/0075646 A1 Mar. 5, 2020

(30) Foreign Application Priority Data

Sep. 4, 2018 (JP) .............................. JP2018-165429

(51) Int. Cl.
*H01L 27/146* (2006.01)
*H04N 5/232* (2006.01)
*H01L 49/02* (2006.01)

(52) U.S. Cl.
CPC .... *H01L 27/14609* (2013.01); *H01L 27/1464* (2013.01); *H01L 27/14605* (2013.01); *H01L 27/14612* (2013.01); *H01L 27/14636* (2013.01); *H01L 27/14683* (2013.01); *H01L 28/60* (2013.01); *H04N 5/23229* (2013.01)

(58) Field of Classification Search
CPC ......... H01L 27/14609; H01L 27/14605; H01L 27/14612; H01L 27/14636; H01L 27/1464; H01L 27/14683

See application file for complete search history.

(56) References Cited

U.S. PATENT DOCUMENTS

| | | | |
|---|---|---|---|
| 8,115,848 B2 | 2/2012 | Onuki et al. | |
| 8,981,276 B2 | 3/2015 | Yamakawa | |
| 9,716,849 B2 | 7/2017 | Kobayashi et al. | |
| 10,009,560 B2 | 6/2018 | Kobayashi et al. | |
| 10,057,519 B2 | 8/2018 | Kobayashi et al. | |
| 10,186,532 B2 | 1/2019 | Kobayashi et al. | |
| 10,263,028 B2 | 4/2019 | Takami et al. | |
| 10,462,400 B2 | 10/2019 | Kobayashi et al. | |
| 10,483,307 B2 | 11/2019 | Sekine et al. | |
| 10,498,979 B2 | 12/2019 | Kobayashi et al. | |
| 2007/0131991 A1 | 6/2007 | Sugawa | |
| 2007/0267705 A1 | 11/2007 | Won et al. | |
| 2013/0001403 A1* | 1/2013 | Yamakawa | H01L 27/14609 250/208.1 |
| 2013/0200479 A1 | 8/2013 | Sakano et al. | |

(Continued)

FOREIGN PATENT DOCUMENTS

JP 6024103 B2 11/2016

*Primary Examiner* — Christine A Enad
(74) *Attorney, Agent, or Firm* — Venable LLP

(57) ABSTRACT

A back-side illuminated imaging device includes a substrate including a photoelectric conversion region, a contact plug connecting a wiring layer and the substrate, and a capacitive element including a first metal electrode and a second metal electrode disposed between the first metal electrode and the substrate. A distance between the second metal electrode and the substrate is shorter than a length of the contact plug. The second metal electrode overlaps at least a part of the photoelectric conversion region in a planar view with respect to a main surface of the substrate.

15 Claims, 12 Drawing Sheets

(56) References Cited

U.S. PATENT DOCUMENTS

| | | | |
|---|---|---|---|
| 2014/0151531 A1* | 6/2014 | Yamashita | H01L 27/14627 |
| | | | 250/208.1 |
| 2016/0043132 A1* | 2/2016 | Ihara | H01L 27/1463 |
| | | | 257/291 |
| 2016/0104762 A1* | 4/2016 | Triyoso | H01L 27/0805 |
| | | | 257/532 |
| 2017/0194372 A1* | 7/2017 | Ha | H01L 27/14614 |
| 2018/0213167 A1 | 7/2018 | Miki et al. | |
| 2018/0213169 A1 | 7/2018 | Onuki et al. | |
| 2019/0037161 A1 | 1/2019 | Ikeda et al. | |
| 2019/0075261 A1* | 3/2019 | Machida | H04N 5/37457 |
| 2019/0132533 A1 | 5/2019 | Kawabata et al. | |
| 2019/0252432 A1 | 8/2019 | Onuki et al. | |

* cited by examiner

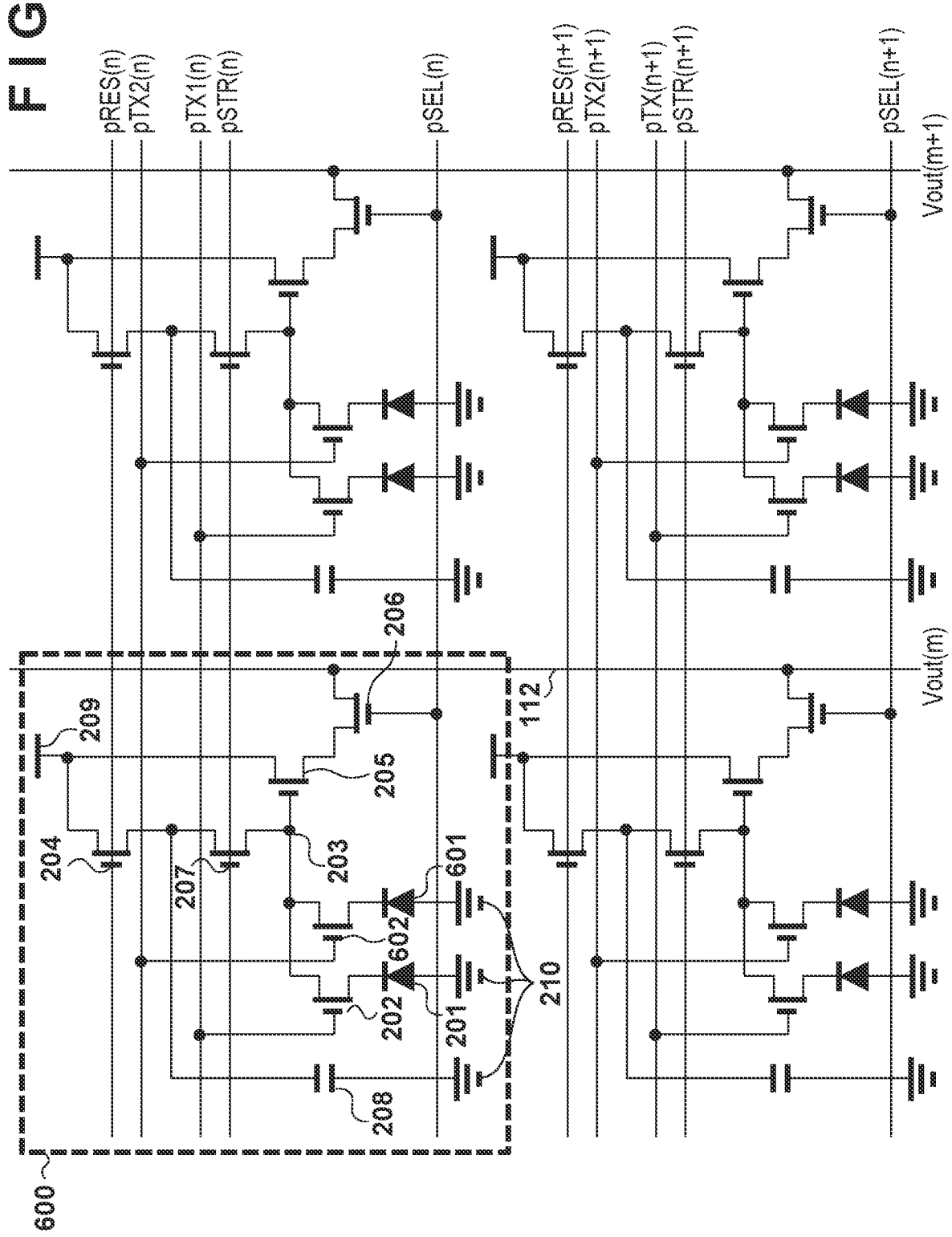

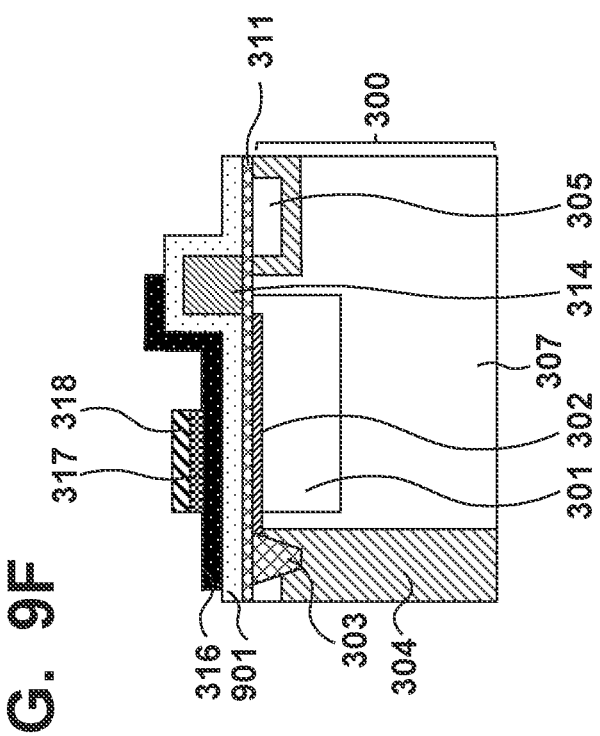
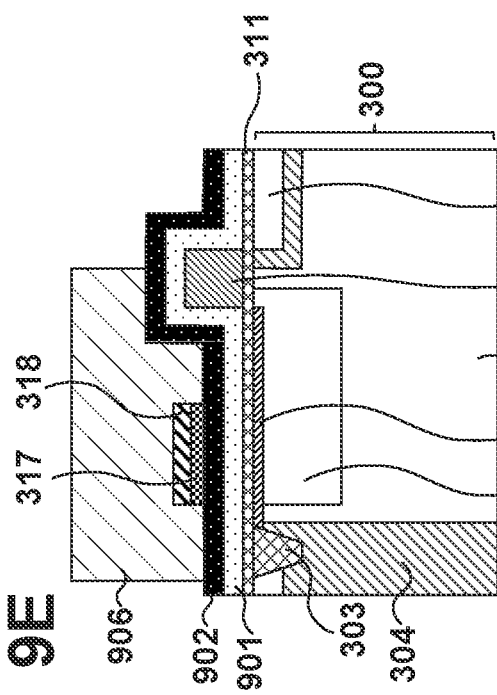
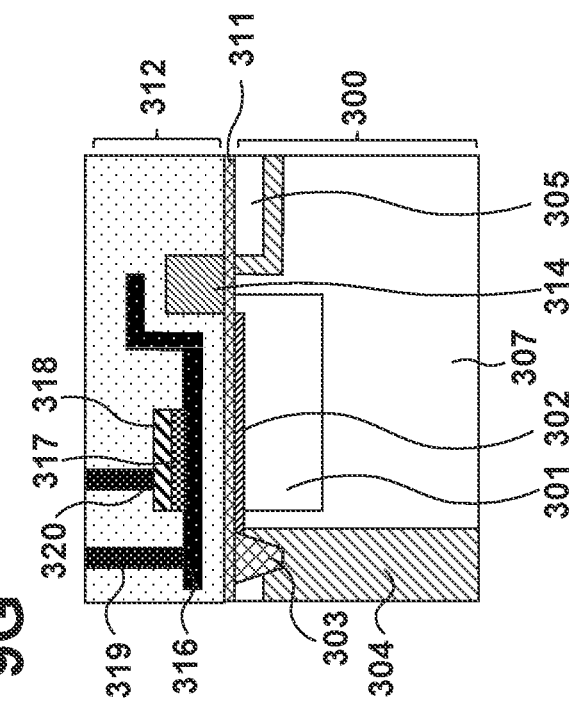

IMAGING DEVICE, METHOD OF MANUFACTURING THE SAME, AND CAMERA

BACKGROUND OF THE INVENTION

Field of the Invention

The present invention relates to an imaging device, a method of manufacturing the same, and a camera.

Description of the Related Art

In order to change a dynamic range and an output voltage at low illumination intensity, an imaging device has been proposed in which a capacitive element is connected to a floating diffusion via a switch element. In this imaging device, the capacitance of the floating diffusion can be dynamically changed. In order to suppress the reduction in the size of a photoelectric conversion region due to a capacitive element being formed on a substrate, Japanese Patent No. 6024103 proposes forming a capacitive element in a wiring layer as an inter-line capacitance.

SUMMARY OF THE INVENTION

In the structure described in Japanese Patent No. 6024103, since a wiring layer is provided with an inter-line capacitance, the degree of freedom of a wiring layout is limited. An aspect of the present invention provides a structure for a capacitive element capable of increasing the degree of freedom of the wiring layout.

According to an embodiment of the present disclosure, a back-side illuminated imaging device, comprising: a substrate including a photoelectric conversion region; a contact plug connecting a wiring layer and the substrate; and a capacitive element including a first metal electrode and a second metal electrode disposed between the first metal electrode and the substrate, wherein a distance between the second metal electrode and the substrate is shorter than a length of the contact plug; and the second metal electrode overlaps at least a part of the photoelectric conversion region in a planar view with respect to a main surface of the substrate is provided.

Further features of the present invention will become apparent from the following description of exemplary embodiments (with reference to the attached drawings).

BRIEF DESCRIPTION OF THE DRAWINGS

FIG. 6 is an equivalent circuit diagram illustrating a configuration of a pixel according to a third embodiment of the present invention.

FIGS. 9A to 9G are cross-sectional schematic diagrams illustrating a method of manufacturing an imaging device according to various embodiments of the present invention.

DESCRIPTION OF THE EMBODIMENTS

Figure 1:
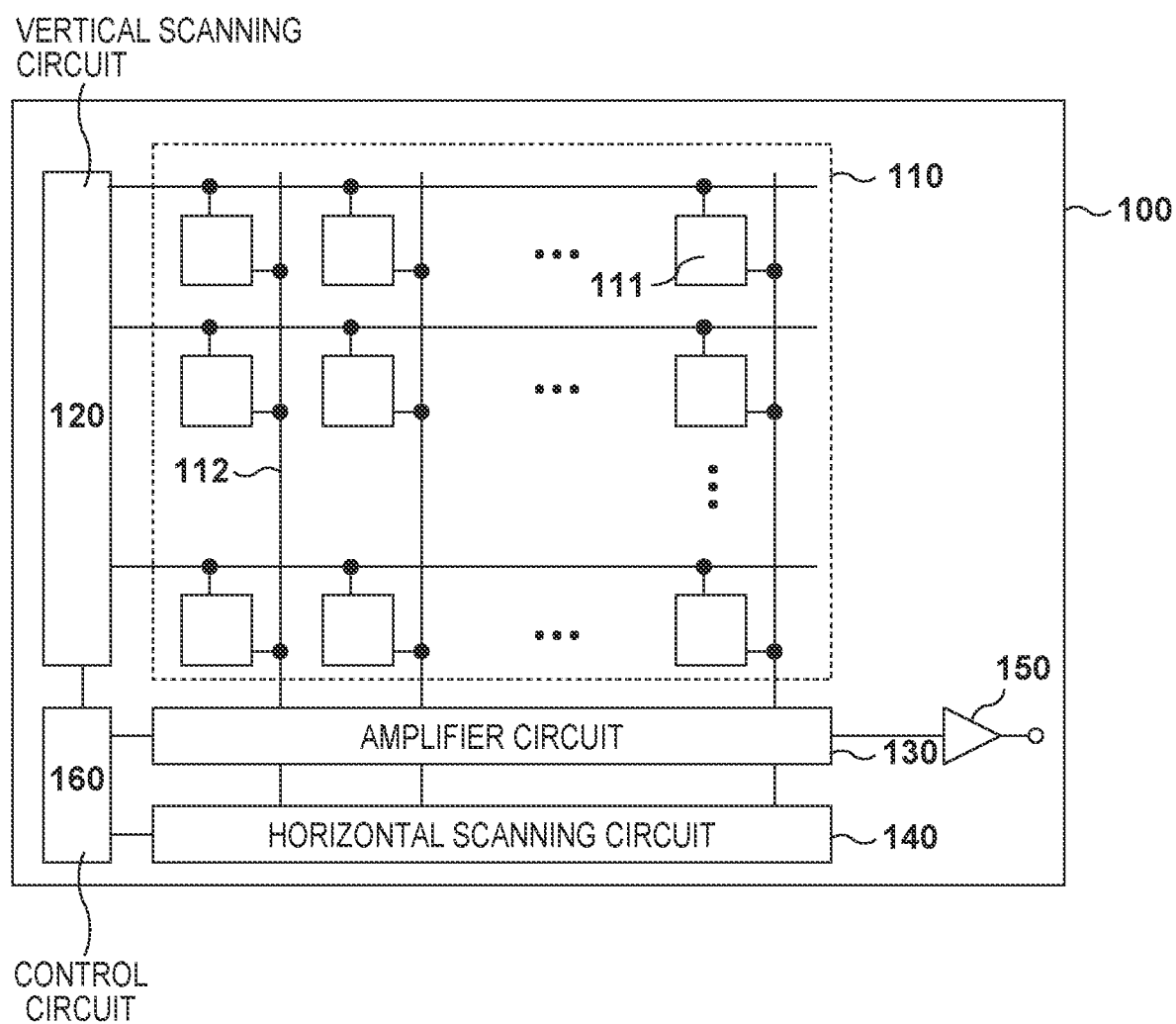
FIG. 1 is a block diagram illustrating a configuration of an imaging device according to various embodiments of the present invention.

Embodiments of the invention are described below with reference to the accompanying drawings. Like elements are given the same reference numerals throughout the various embodiments, and redundant descriptions thereof are omitted. Furthermore, each embodiment can be changed and combined as appropriate.

First Embodiment

A first embodiment of the present invention will be described with reference to FIGS. 1 to 3. FIG. 1 is a block diagram illustrating a schematic configuration of an imaging device 100 of the present embodiment. The imaging device 100 includes a pixel array 110, a vertical scanning circuit 120, an amplifier circuit 130, a horizontal scanning circuit 140, an output circuit 150, and a control circuit 160.

The pixel array 110 includes a plurality of pixel circuits 111 arranged in XY rows and columns. The vertical scanning circuit 120 supplies control signals for controlling the transistors of the pixel circuit 111 to turn on or off. A logic circuit such as a shift register or an address decoder may be used in the vertical scanning circuit 120. Vertical output lines 112 are provided in each column of the pixel circuits 111. Signals from the pixel circuits 111 are read to the vertical output lines 112 for each column. The amplifier circuit 130 amplifies a pixel signal output to the vertical output line 112 and performs correlated double sampling processing based on a signal at a time of reset and a signal at a time of photoelectric conversion. The horizontal scanning circuit 140 supplies a control signal for controlling a switch connected to an amplifier of the amplifier circuit 130 to turn on or off. The output circuit 150 includes a buffer amplifier, a differential amplifier, and the like and outputs a pixel signal from the amplifier circuit 130 to a signal processing unit outside the imaging device 100. The imaging device 100 may further include an AD converter to output a digital image signal. The control circuit 160 controls an operation of each component of the imaging device 100.

Figure 2:
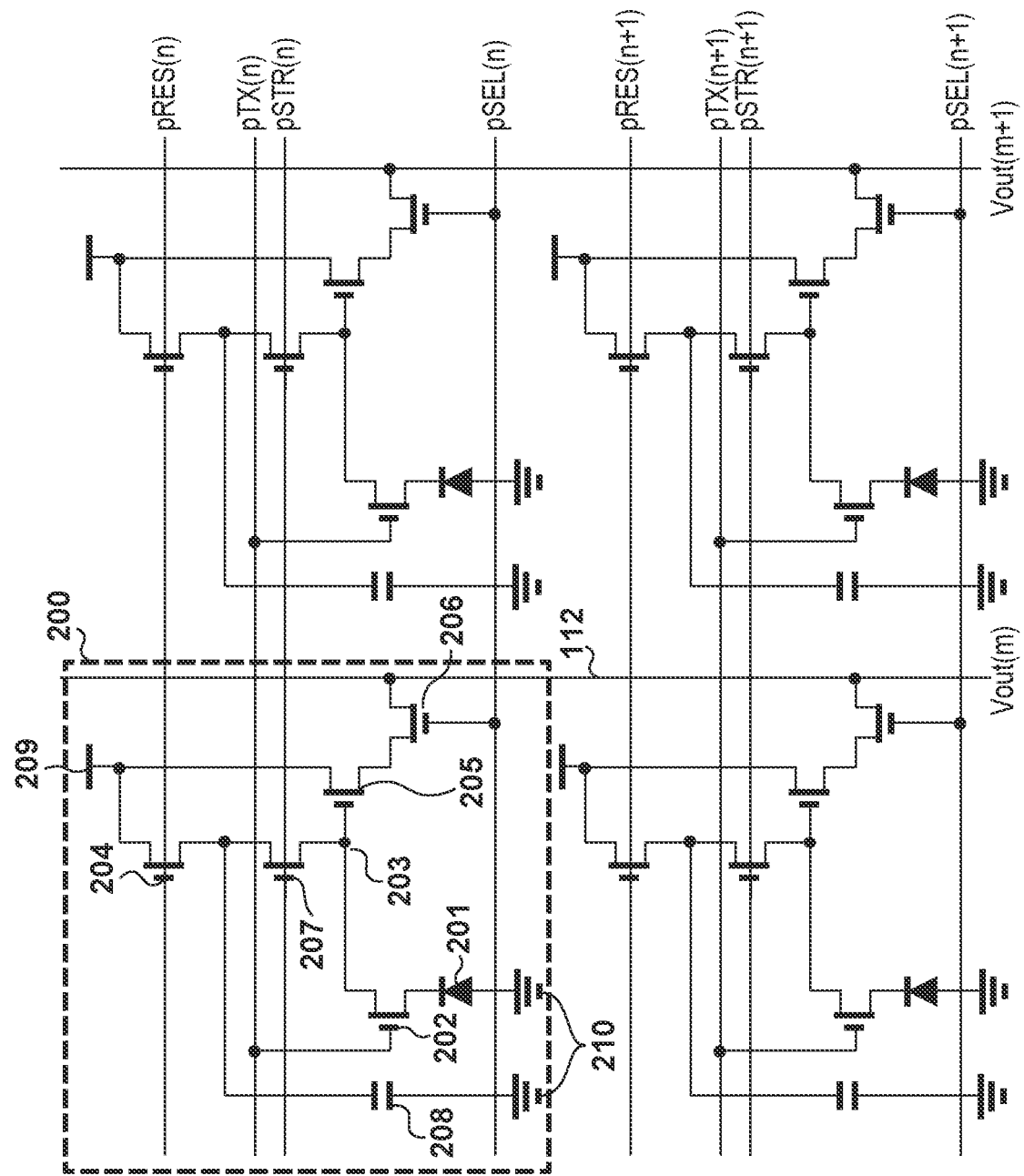
FIG. 2 is an equivalent circuit diagram illustrating a configuration of a pixel according to a first embodiment of the present invention.

FIG. 2 illustrates an equivalent circuit of a pixel circuit 200 according to the present embodiment. The pixel circuit 200 corresponds to the pixel circuit 111 in FIG. 1. FIG. 2 illustrates four pixel circuits 200 of 2 rows×2 columns among a plurality of pixel circuits 200 arranged in two dimensions in a row direction and a column direction. In general, the imaging device 100 has more of the pixel circuits 200.

Each of the plurality of pixel circuits 200 includes a photoelectric conversion element 201 (hereinafter, PD 201), a transfer transistor 202, and a floating diffusion 203 (hereinafter, FD 203). Each of the plurality of pixel circuits 200 includes a reset transistor 204, an amplifier transistor 205, a selection transistor 206, a capacitive connection transistor 207, and a capacitive element 208. The reset transistor 204, the selection transistor 206, and the capacitive connection transistor 207 each function as a switch element.

The PD 201 photoelectrically converts incident light and accumulates the photoelectrically converted charge. The transfer transistor 202 transfers the charge accumulated in the PD 201 to the FD 203 in response to being turned on. The FD 203 converts the charge generated at PD 201 into a voltage. The amplifier transistor 205 constitutes a source follower and outputs a signal based on the voltage of the FD 203 to the vertical output line 112 (Vout (m) in the m-th column) via the selection transistor 206.

The capacitive element 208 is electrically connected to a signal path from the PD 201 to the FD 203. Specifically, the capacitive element 208 is electrically connected to the FD 203 via the capacitive connection transistor 207. The charge transferred from the PD 201 is accumulated in the capacitance of the FD 203. Furthermore, the charge transferred from the PD 201 is also accumulated in the capacitive element 208 when the capacitive connection transistor 207 is on. That is, when the capacitive connection transistor 207 is on, the charge transferred from the PD 201 is accumulated in the capacitance of the FD 203 and the capacitive element 208. On the other hand, when the capacitive connection transistor 207 is off, the charge transferred from the PD 201 is accumulated in the capacitance of the FD 203 but is not accumulated in the capacitive element 208.

In response to the reset transistor 204 being turned on, a voltage of the capacitive element 208 is reset to a voltage of a power supply voltage source 209. Further, in response to the reset transistor 204 and the capacitive connection transistor 207 being simultaneously turned on, a voltage of the FD 203 is reset to the voltage of the power supply voltage source 209.

A common control signal is supplied from the vertical scanning circuit 120 to the pixel circuits 200 in the same row. Specifically, control signals pTX (n), pRES (n), pSEL (n) and pSTR (n) are respectively supplied to the transfer transistor 202, the reset transistor 204, the selection transistor 206, and the capacitive connection transistor 207 in the n-th row. These transistors are turned on when the control signal is at a high level and are turned off when the control signal is at a low level. The capacitive connection transistor 207 switches connection/disconnection between the FD 203 and the capacitive element 208. The capacitive connection transistor 207 is driven according to the control signal pSTR (n) and connects the capacitive element 208 to the FD 203 at the timing when the control signal pSTR (n) is turned on in a pulse shape.

The amount of charge that can be accumulated by the FD 203 is determined by the capacitance of the FD 203. The capacitance of the FD 203 can be dynamically increased by connecting the capacitive element 208 to the FD 203 via the capacitive connection transistor 207 in order to change the dynamic range, or the output voltage at low illumination intensity, and the like. When the capacitance that can be accumulated by the FD 203 is small, the slope of the signal amount of the output signal with respect to the amount of incident light is steep (high gain) as compared with a case where the capacitance that can be accumulated by the FD 203 is large. Therefore, the control circuit 160 can output the signal level with high gain by turning off the capacitive connection transistor 207 when the amount of incident light is small, thereby reducing the capacitance of the charge that can be accumulated in the FD 203. On the other hand, when the amount of incident light is large, the control circuit 160 turns on the capacitive connection transistor 207 to increase the capacitance of the charge that can be accumulated in the FD 203, thereby making it possible to cope with a large amount of light.

Figure 3:
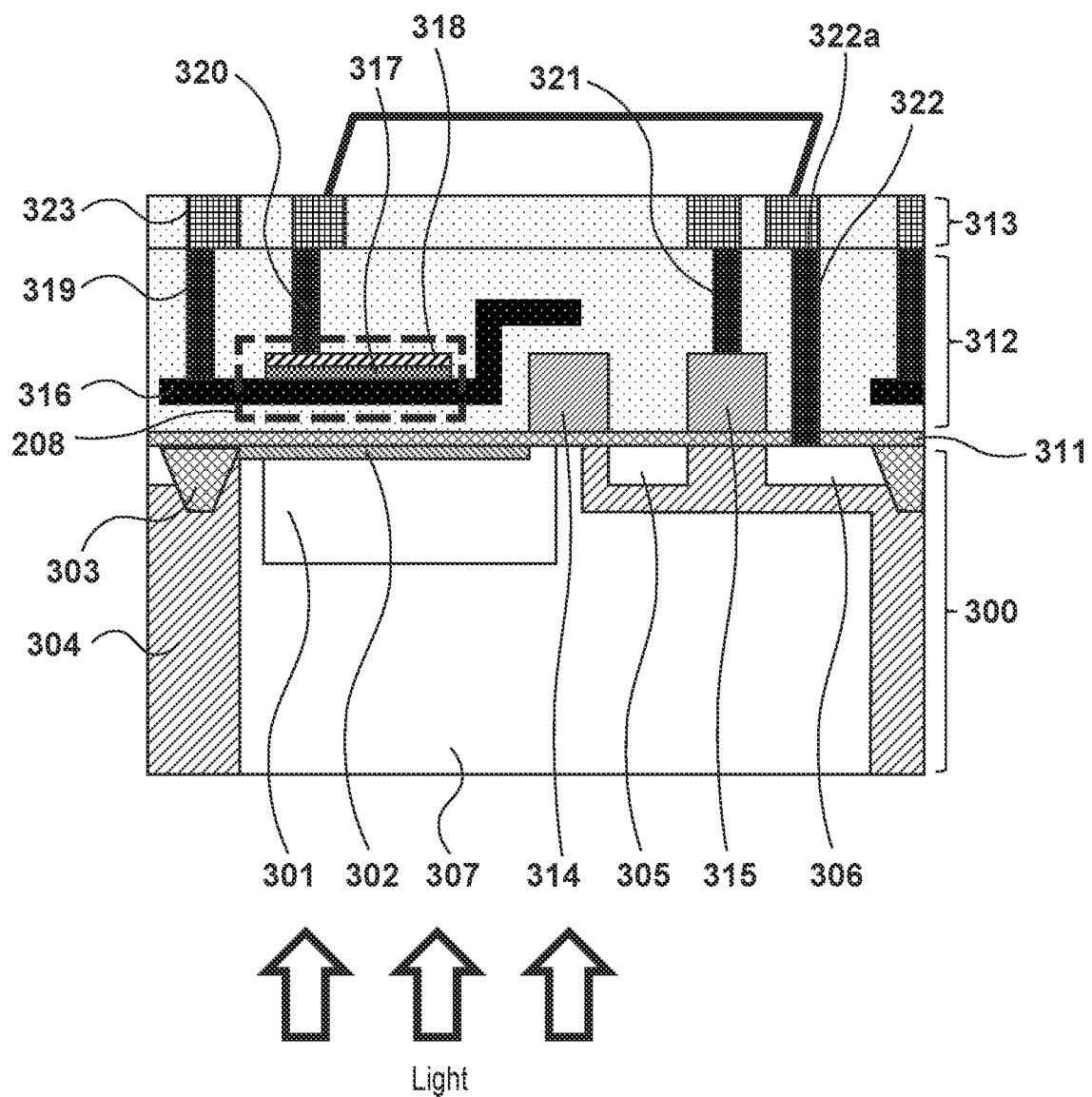
FIG. 3 is a cross-sectional schematic diagram illustrating the configuration of the pixel according to the first embodiment of the present invention.

FIG. 3 is a cross-sectional view of the pixel circuit 200 along the PD 201, the transfer transistor 202, the FD 203, the capacitive connection transistor 207, and the capacitive element 208 in FIG. 2. The same members are denoted by the same reference numerals in the respective drawings. In the following embodiments, a case where electrons are used as signal charges will be described, but holes may be used as signal charges. In that case, the conductivity types of the respective regions are opposite to each other. As illustrated in FIG. 3, the imaging device 100 is a back-side illuminated imaging device. The back-side illuminated imaging device is an imaging device having a structure in which light is incident from the side opposite to the wiring layer with respect to the substrate.

A substrate 300 is, for example, a semiconductor substrate. The substrate 300 includes a photoelectric conversion region 301, a surface region 302, an element isolation region 303, a pn junction isolation region 304, an impurity region 305, and an impurity region 306. The photoelectric conversion region 301 is an n-type impurity region and constitutes the PD 201. Light incident on the photoelectric conversion region 301 is photoelectrically converted into charges. The surface region 302 is a p-type impurity region and is located on the substrate surface side of the photoelectric conversion region 301. The surface region 302 forms a pn junction with the photoelectric conversion region 301. The PD 201 has an embedded diode configuration that can suppress interface noise due to the surface region 302. A deep region 307 of the substrate 300 is an n-type region having a concentration lower than that of the photoelectric conversion region 301. Charges photoelectrically converted at a deep position of the substrate 300 are collected in the photoelectric conversion region 301 by this concentration difference. The deep region 307 of the substrate 300 may be a p-type region.

The element isolation region 303 is constituted by LOCOS or STI. The pn junction isolation region 304 is a p-type impurity region. The element isolation region 303 and the pn junction isolation region 304 isolate the pixel circuits adjacent to each other. The impurity region 305 functions as the FD 203. The impurity region 306 functions as one main electrode of the capacitive connection transistor 207.

The imaging device 100 includes a gate insulating film 311 on the substrate 300. The gate insulating film 311 constitutes a gate insulating film of various transistors including the transfer transistor 202 and the capacitive connection transistor 207. A gate electrode 314 and a gate electrode 315 are formed on the gate insulating film 311. A gate electrode 314 constitutes a gate of the transfer transistor 202. A gate electrode 315 constitutes a gate of the capacitive connection transistor 207.

The imaging device 100 includes an insulating layer 312 on the gate insulating film 311 and the gate electrodes 314 and 315, and a wiring layer 313 on the insulating layer 312. The imaging device 100 includes a lower metal electrode 316, a capacitive insulating film 317, an upper metal electrode 318, and contact plugs 319 to 322, inside the insulating layer 312. The wiring layer 313 includes a conductive pattern 323.

The capacitive insulating film 317 is located between the lower metal electrode 316 and the upper metal electrode 318. The lower metal electrode 316, the capacitive insulating film 317, and the upper metal electrode 318 form an MIM (Metal-Insulator-Metal) type of the capacitive element 208. The dielectric constant of the capacitive insulating film 317 may be higher than that of the insulating layer 312.

The contact plug 319 physically connects the lower metal electrode 316 and a part of the conductive pattern 323 to each other. The contact plug 320 physically connects the upper metal electrode 318 and a part of the conductive pattern 323 to each other. The contact plug 321 physically connects the gate electrode 315 and a part of the conductive pattern 323 to each other. The contact plug 322 physically connects the impurity region 306 and a part of the conductive pattern 323 to each other. By these connections, the impurity region 306 and the upper metal electrode 318 are electrically connected to each other via the contact plug 320, a part of the conductive pattern 323, and the contact plug 322.

The upper metal electrode 318 and the lower metal electrode 316 are each located between the wiring layer 313 and the substrate 300. Therefore, the distance between the upper metal electrode 318 and the substrate 300 is shorter than the length of the contact plug 322, and the distance between the lower metal electrode 316 and the substrate 300 is shorter than the length of the contact plug 322. Here, the distance between the upper metal electrode 318 and the substrate 300 may be a minimum distance between a certain point in the upper metal electrode 318 and a certain point in the substrate 300. The same applies to the distance between the lower metal electrode 316 and the substrate 300. The upper metal electrode 318 is located between the lower metal electrode 316 and the wiring layer 313. The lower metal electrode 316 is located between the upper metal electrode 318 and the substrate 300. Here, "the lower metal electrode 316 is located between the upper metal electrode 318 and the substrate 300" means that at least a part of the lower metal electrode 316 may be located between them, and the lower metal electrode 316 may include a portion not located between them as illustrated in FIG. 3. Since the upper metal electrode 318 and the lower metal electrode 316 are located between the wiring layer 313 and the substrate 300, the capacitive element 208 with a large capacitance can be formed without being limited by a layout of the wiring layer 313. Furthermore, the parasitic capacitance between the metal electrode of the capacitive element 208 and the conductive pattern 323 of the wiring layer 313 may be reduced, which can reduce unnecessary increase of the capacitance value of the FD 203.

Instead of the example of FIG. 3, the upper metal electrode 318 may be included in the wiring layer 313, and the lower metal electrode 316 may be located between the wiring layer 313 and the substrate 300. Even in this case, the limitation of the layout of the wiring layer 313 can be relaxed by the amount of the lower metal electrode 316. The lower metal electrode 316 is connected to a ground voltage source 210. Instead, the lower metal electrode 316 may be connected to a power supply voltage source 209.

The lower metal electrode 316 is at a position overlapping at least a part of the photoelectric conversion region 301 in a planar view with respect to a main surface of the substrate 300. The main surface of the substrate 300 may be the upper surface of the substrate 300 (the surface joined to the gate insulating film 311). As illustrated in FIG. 3, the lower metal electrode 316 may overlap the entire surface of the photoelectric conversion region 301 in a planar view with respect to the main surface of the substrate 300. Instead the lower metal electrode 316 may overlap only a part of the photoelectric conversion region 301 in a planar view with respect to the main surface of the substrate 300. Since the imaging device 100 according to the present embodiment is a backside illumination type, even if the lower metal electrode 316 is at a position overlapping the photoelectric conversion region 301, the amount of light incident on the photoelectric conversion region 301 does not decrease. Furthermore, the lower metal electrode 316 can function as a reflective film that reflects light transmitted through the substrate 300 toward the photoelectric conversion region 301. In order to improve the function as a reflective film, the lower metal electrode 316 may have a step along a side surface and an upper surface of the gate electrode 314. Further, although the capacitive connection transistor 207 is provided between the reset transistor 204 and the FD 203 in FIG. 2, the capacitive connection transistor 207 may not be provided between the reset transistor 204 and the FD 203.

Second Embodiment

Figure 4:
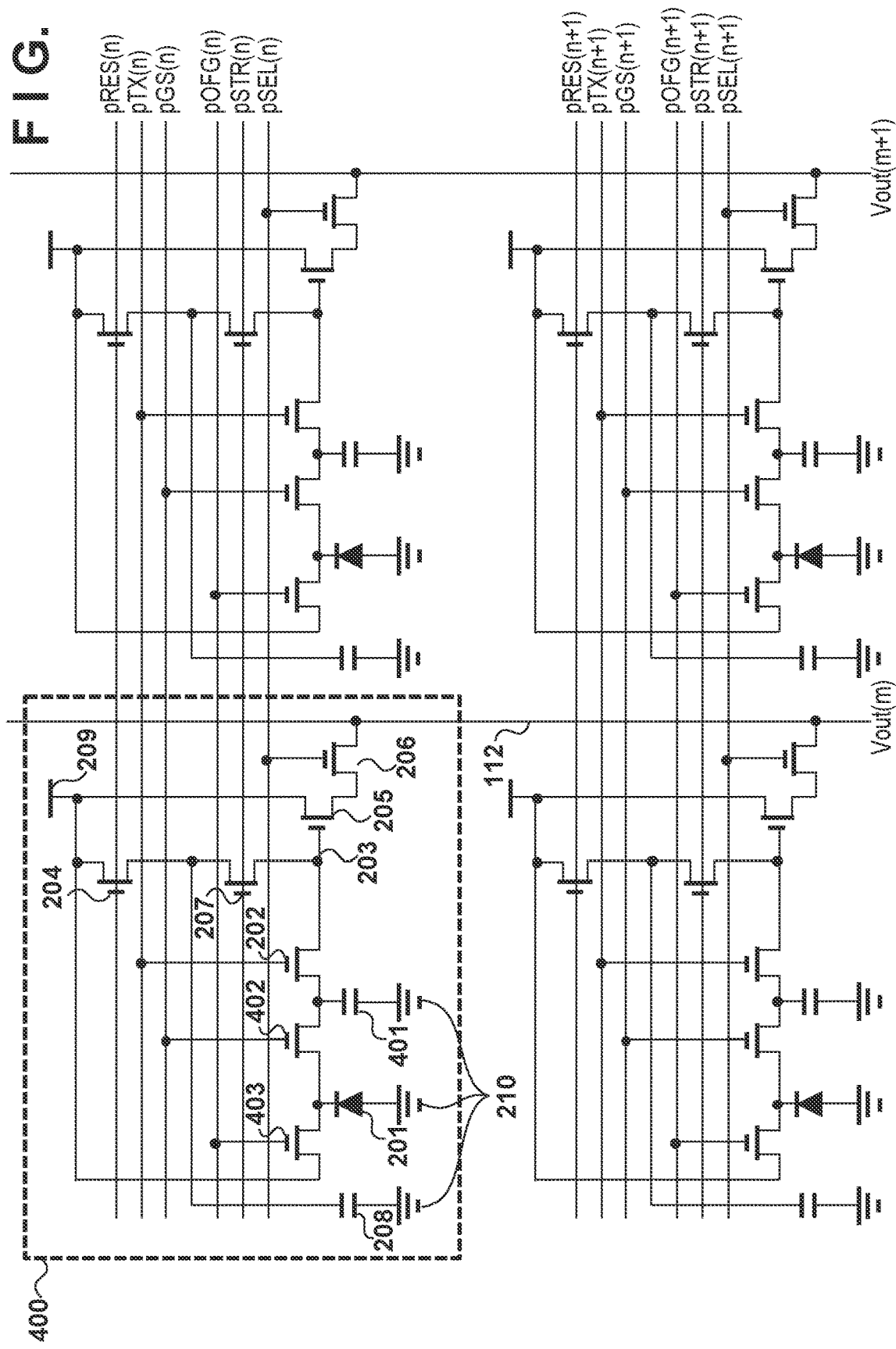
FIG. 4 is an equivalent circuit diagram illustrating a configuration of a pixel according to a second embodiment of the present invention.

A second embodiment of the present invention will be described with reference to FIGS. 4 and 5. The overall configuration of the imaging device is the same as that of the imaging device 100 in FIG. 1. In the present embodiment, a pixel circuit 400 illustrated in FIG. 4 is used as the pixel circuit 111 of the imaging device 100. FIG. 4 illustrates an equivalent circuit of the pixel circuit 400 according to the present embodiment. The differences between the pixel circuit 200 and the pixel circuit 400 will be mainly described below. The part the description of which is omitted may be similar to the pixel circuit 200.

The pixel circuit 400 further includes a capacitive element 401, a global transfer transistor 402, and a charge discharging transistor 403, as compared with the pixel circuit 200. The global transfer transistor 402 and the transfer transistor 202 are connected in series between the PD 201 and the FD 203. The capacitive element 401 is connected to a node between the global transfer transistor 402 and the transfer transistor 202. The charge discharging transistor 403 connects the node between the PD 201 and the global transfer transistor 402 to the power supply voltage source 209.

When the global transfer transistor 402 is turned on, the charge generated in the PD 201 is transferred to the capacitive element 401. The control circuit 160 turns on the global transfer transistors 402 of all the pixel circuits 400 included in the pixel array 110 at one time. By this, a global shutter function is realized. The capacitive element 401 holds the transferred charge. Thereafter, when the transfer transistor 202 is turned on, the charge held in the capacitive element 401 is transferred to the FD 203. When the charge discharging transistor 403 is turned on, the surplus charge generated in the PD 201 is discharged. When the charge discharging transistor 403 is turned off, the PD 201 can accumulate charge. The control circuit 160 supplies signals collectively to the global transfer transistors 402 through the control signal pGS (n) and supplies signals collectively to the charge discharging transistors 403 through the control signal pOFG (n).

Figure 5:
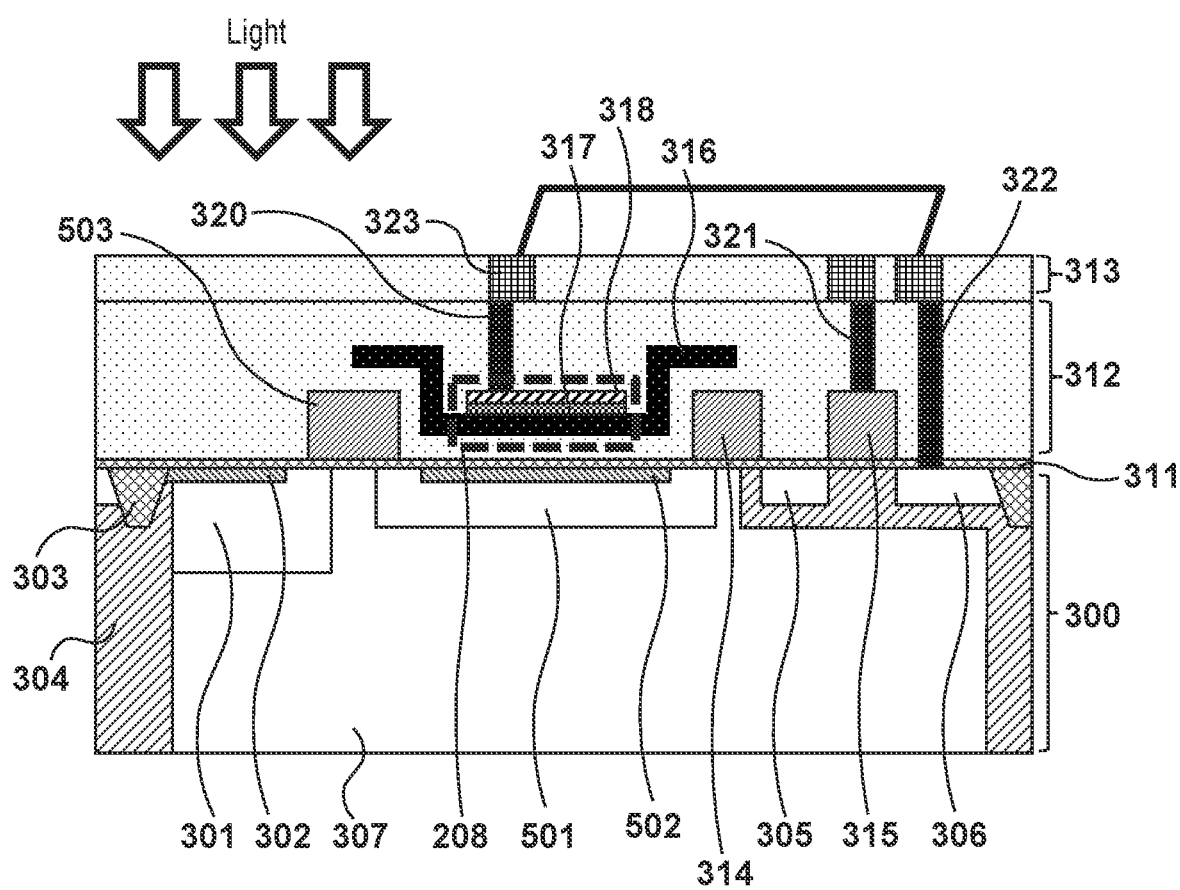
FIG. 5 is a cross-sectional schematic diagram illustrating the configuration of the pixel according to the second embodiment of the present invention.

FIG. 5 is a cross-sectional view of the pixel circuit 400 along the PD 201, the transfer transistor 202, the FD 203, the capacitive connection transistor 207, the capacitive element 208, the capacitive element 401, and the global transfer transistor 402, in FIG. 4. As illustrated in FIG. 5, the imaging device 100 is a front-side illuminated imaging device. The front-side illuminated imaging device is an imaging device having a structure in which light is incident from the same side as the wiring layer with respect to the substrate.

The pixel circuit 400 further includes an impurity region 501, a surface region 502, and a gate electrode 503, as compared with the pixel circuit 200. The impurity region 501 is an n-type impurity region and constitutes a capacitive element 401. The surface region 502 is a p-type impurity region and is located on the substrate surface side of the impurity region 501. The surface region 502 forms a pn junction with the impurity region 501. The capacitive element 401 has an embedded diode configuration that can suppress interface noise due to the surface region 502. The gate electrode 314 is a gate of the global transfer transistor 402.

The lower metal electrode 316 is at a position overlapping at least a part of the impurity region 501 in a planar view with respect to the main surface of the substrate 300. As illustrated in FIG. 5, the lower metal electrode 316 may overlap the entire surface of the impurity region 501 in a planar view with respect to the main surface of the substrate 300. Instead, the lower metal electrode 316 may overlap only a part of the impurity region 501 in a planar view with respect to the main surface of the substrate 300. Since the imaging device 100 of the present embodiment is of a front-side illumination type, even if the lower metal electrode 316 is at a position overlapping the impurity region 501, the amount of light incident on the photoelectric conversion region 301 does not decrease. Furthermore, the lower metal electrode 316 can function as a light shielding film that shields light traveling toward the impurity region 501. In order to improve the function as a light shielding film, the lower metal electrode 316 may have a step along the side surface and the upper surface of the gate electrode 503 and along the side surface and the upper surface of the gate electrode 314.

Third Embodiment

A third embodiment of the present invention will be described with reference to FIGS. 6 to 7D. The overall configuration of the imaging device is the same as that of the imaging device 100 in FIG. 1. In the present embodiment, a pixel circuit 600 illustrated in FIG. 6 is used as the pixel circuit 111 of the imaging device 100. FIG. 6 illustrates an equivalent circuit of the pixel circuit 600 according to the present embodiment. The differences between the pixel circuit 200 and the pixel circuit 600 will be mainly described below. The part the description of which is omitted may be similar to the pixel circuit 200.

The pixel circuit 600 further includes a PD 601 and a transfer transistor 602 as compared with the pixel circuit 200. One pixel circuit 600 includes two PDs 201 and 601. The PD 201 is connected to the FD 203 via the transfer transistor 202, and the PD 601 is connected to the same FD 203 via the transfer transistor 602. That is, the FD 203 converts the charges generated in each of the PD 201 and the PD 601 into a voltage.

In this configuration, for example, by arranging one microlens in one pixel circuit 600, a so-called on-imaging surface phase difference autofocus can be performed. In addition, for example, by arranging separate microlenses in the PD 201 and 601, a so-called two-pixel sharing can be performed. In two-pixel sharing, by reducing the number of transistors corresponding to one PD, the area of the photoelectric conversion region can be increased, so the photoelectric conversion efficiency can be improved. The number of sets of PDs and transfer transistors in one pixel circuit 600 is not limited to two but may be three or more.

Figure 7A:
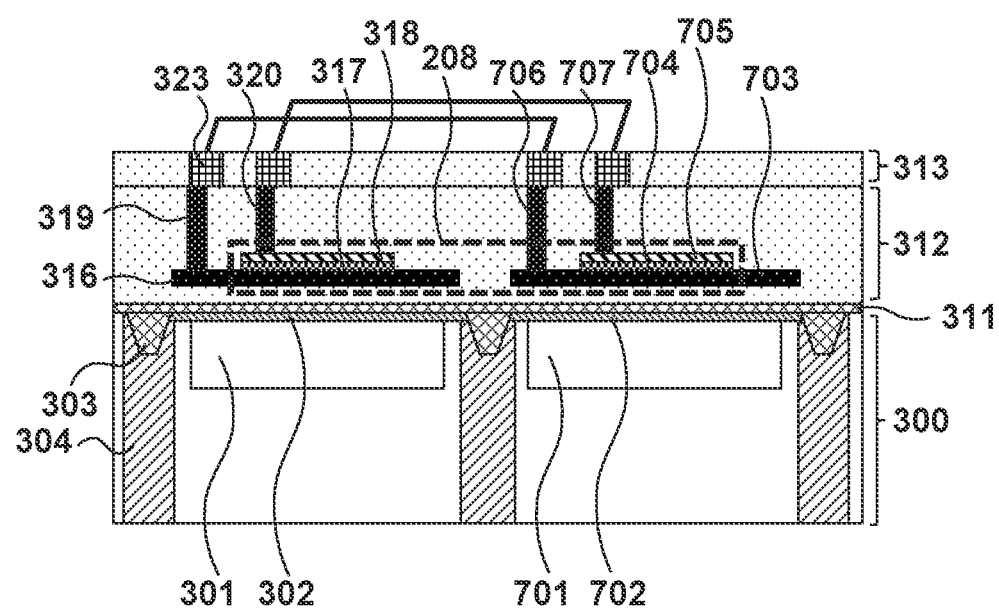
FIGS. 7A to 7D are cross-sectional schematic diagrams illustrating the configuration of the pixel according to the third embodiment of the present invention.

FIG. 7A is a cross-sectional view of the pixel circuit 600 along the PD 201, the PD 601, and the capacitive element 208, in FIG. 6. The imaging device 100 of the present embodiment is a back-side illuminated imaging device.

The pixel circuit 600 further includes an impurity region 701, a surface region 702, a lower metal electrode 703, a capacitive insulating film 704, an upper metal electrode 705, and contact plugs 706 and 707, as compared with the pixel circuit 200.

The photoelectric conversion region 701 is an n-type impurity region and constitutes the PD 601. Light incident on the photoelectric conversion region 701 is photoelectrically converted into charges. The surface region 702 is a p-type impurity region and is located on the substrate surface side of the photoelectric conversion region 701. The surface region 702 forms a pn junction with the photoelectric conversion region 701. The PD 601 has an embedded diode configuration that can suppress interface noise due to the surface region 702.

The capacitive insulating film 704 is sandwiched between the lower metal electrode 703 and the upper metal electrode 705. The contact plug 706 physically connects the lower metal electrode 703 and a part of the conductive pattern 323 to each other. The contact plug 707 physically connects the upper metal electrode 705 and a part of the conductive pattern 323 to each other. By these connections, the upper metal electrode 318 and the upper metal electrode 705 are electrically connected to each other via the contact plug 320, a part of the conductive pattern 323, and the contact plug 707. The lower metal electrode 316 and the lower metal electrode 703 are electrically connected to each other via the contact plug 319, a part of the conductive pattern 323, and the contact plug 706. Therefore, a capacitive element formed of the capacitive insulating film 704, the lower metal electrode 703, and the upper metal electrode 705 constitutes a part of the capacitive element 208.

The upper metal electrode 705 and the lower metal electrode 703 are located between the wiring layer 313 and the substrate 300, respectively. The upper metal electrode 705 is located between the lower metal electrode 703 and the wiring layer 313. The lower metal electrode 703 is located between the upper metal electrode 705 and the substrate 300. Instead of the example of FIG. 7A, the upper metal electrode 705 may be included in the wiring layer 313, and the lower metal electrode 703 may be located between the wiring layer 313 and the substrate 300. Even in this case, the limitation of the layout of the wiring layer 313 can be relaxed by the amount of the lower metal electrode 703.

The lower metal electrode 316 and the lower metal electrode 703 are at the same height from the main surface of the substrate 300 and have the same thickness. The capacitive insulating film 317 and the capacitive insulating film 704 are at the same height from the main surface of the substrate 300 and have the same thickness. The upper metal electrode 318 and the upper metal electrode 705 are at the same height from the main surface of the substrate 300 and have the same thickness.

The lower metal electrode 703 is at a position overlapping at least a part of the photoelectric conversion region 701 in a planar view with respect to the main surface of the substrate 300. As illustrated in FIG. 7A, the lower metal electrode 703 may overlap the entire surface of the photoelectric conversion region 701 in a planar view with respect to the main surface of the substrate 300. Instead, the lower metal electrode 703 may overlap only a part of the photoelectric conversion region 701 in a planar view with respect to the main surface of the substrate 300. Since the imaging device 100 according to the present embodiment is of a back-side illumination type, even if the lower metal electrode 703 is at a position overlapping the photoelectric conversion region 701, the amount of light incident on the photoelectric conversion region 701 does not decrease. Furthermore, the lower metal electrode 703 can function as a reflective film that reflects light transmitted through the substrate 300 toward the photoelectric conversion region 701.

Figure 7B:
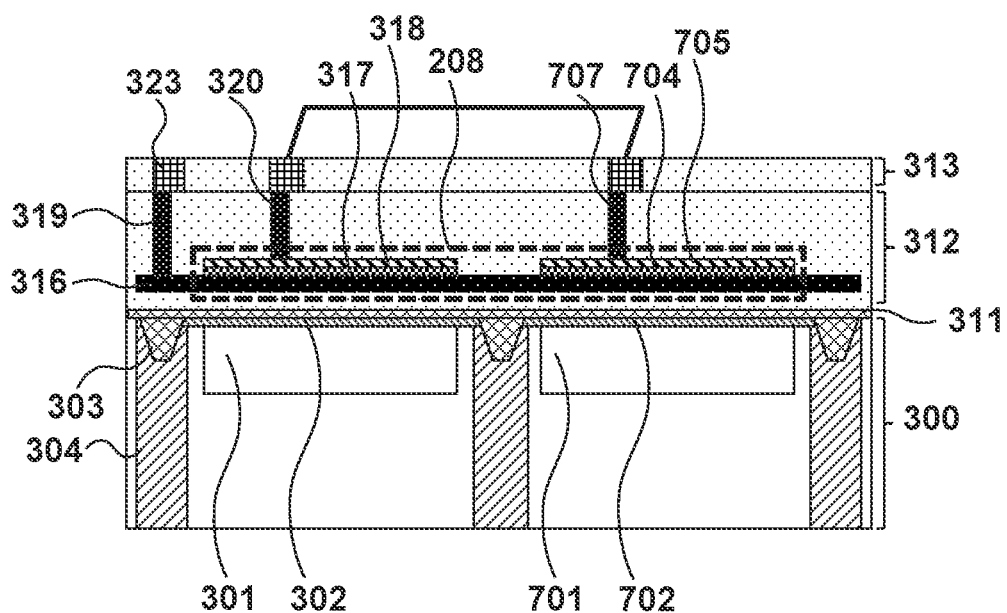

In the example illustrated in FIG. 7B, the imaging device 100 does not include the lower metal electrode 703 and the contact plug 706 as compared with the example illustrated in FIG. 7A. Instead, the lower metal electrode 316 extends from a position overlapping at least a part of the photoelectric conversion region 301 to a position overlapping at least a part of the photoelectric conversion region 701. In this configuration, the space for the contact plug 706 and the conductive pattern connected thereto can be saved, which leads to additional layout freedom.

Figure 7C:
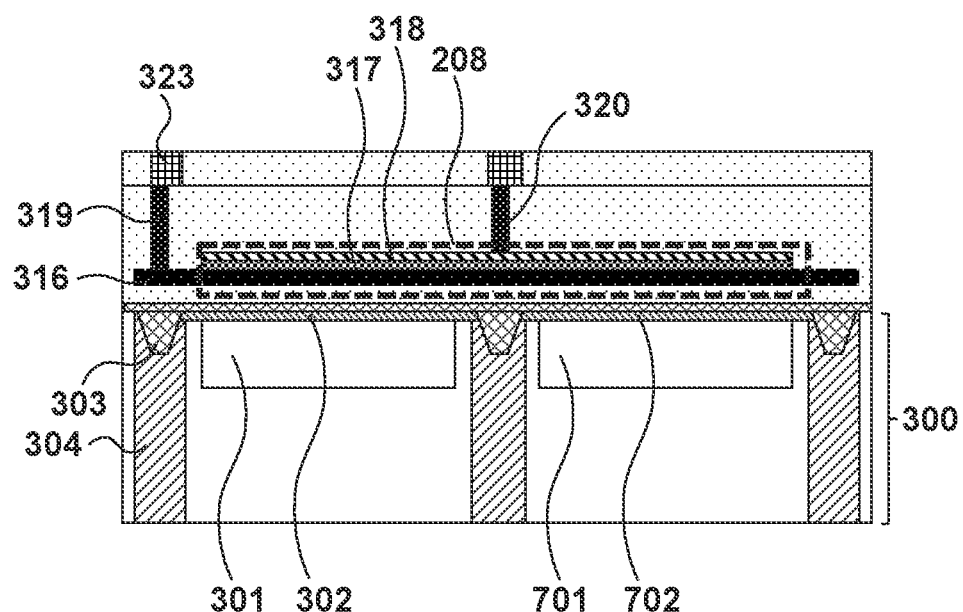

In the example illustrated in FIG. 7C, the imaging device 100 does not include the capacitive insulating film 704, the upper metal electrode 705, and the contact plug 707, as compared with the example illustrated in FIG. 7B. Instead, the upper metal electrode 318 extends from a position overlapping at least a part of the photoelectric conversion region 301 to a position overlapping at least a part of the photoelectric conversion region 701. In this configuration, the space for the contact plug 707 and the conductive pattern connected thereto can be saved, which leads to additional layout freedom.

Figure 7D:
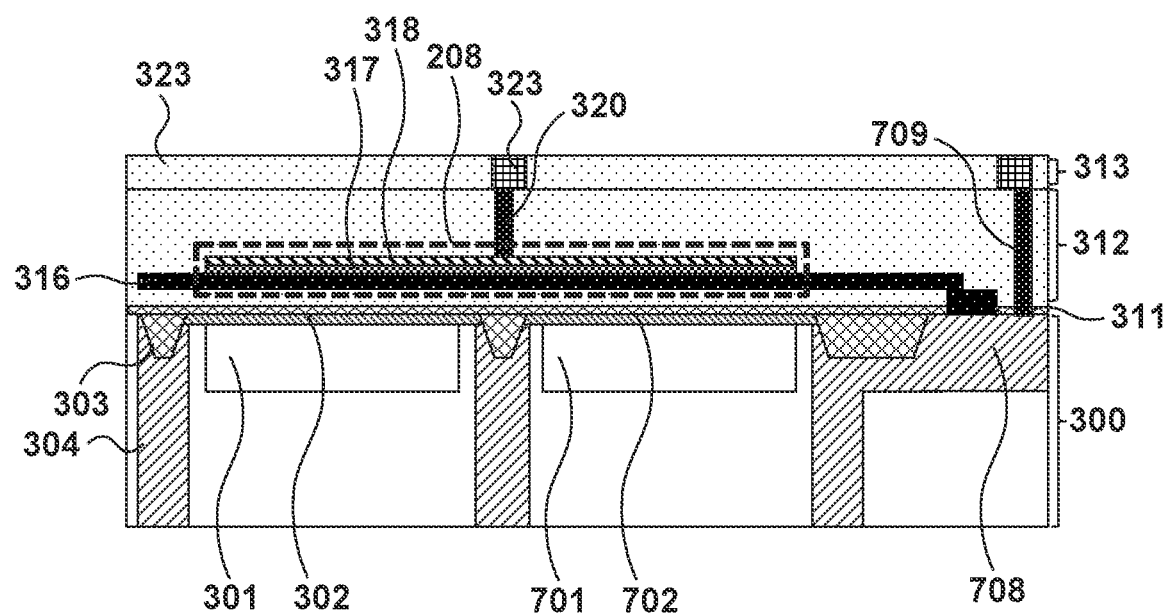

In the example illustrated in FIG. 7D, a contact plug 709 is also connected to a region 708 where the lower metal electrode 316 is connected to the region 708 of the substrate 300 to which a ground voltage is supplied. The ground voltage is supplied to the region 708 through a part of the conductive pattern 323 and the contact plug 709.

Fourth Embodiment

Figure 8:
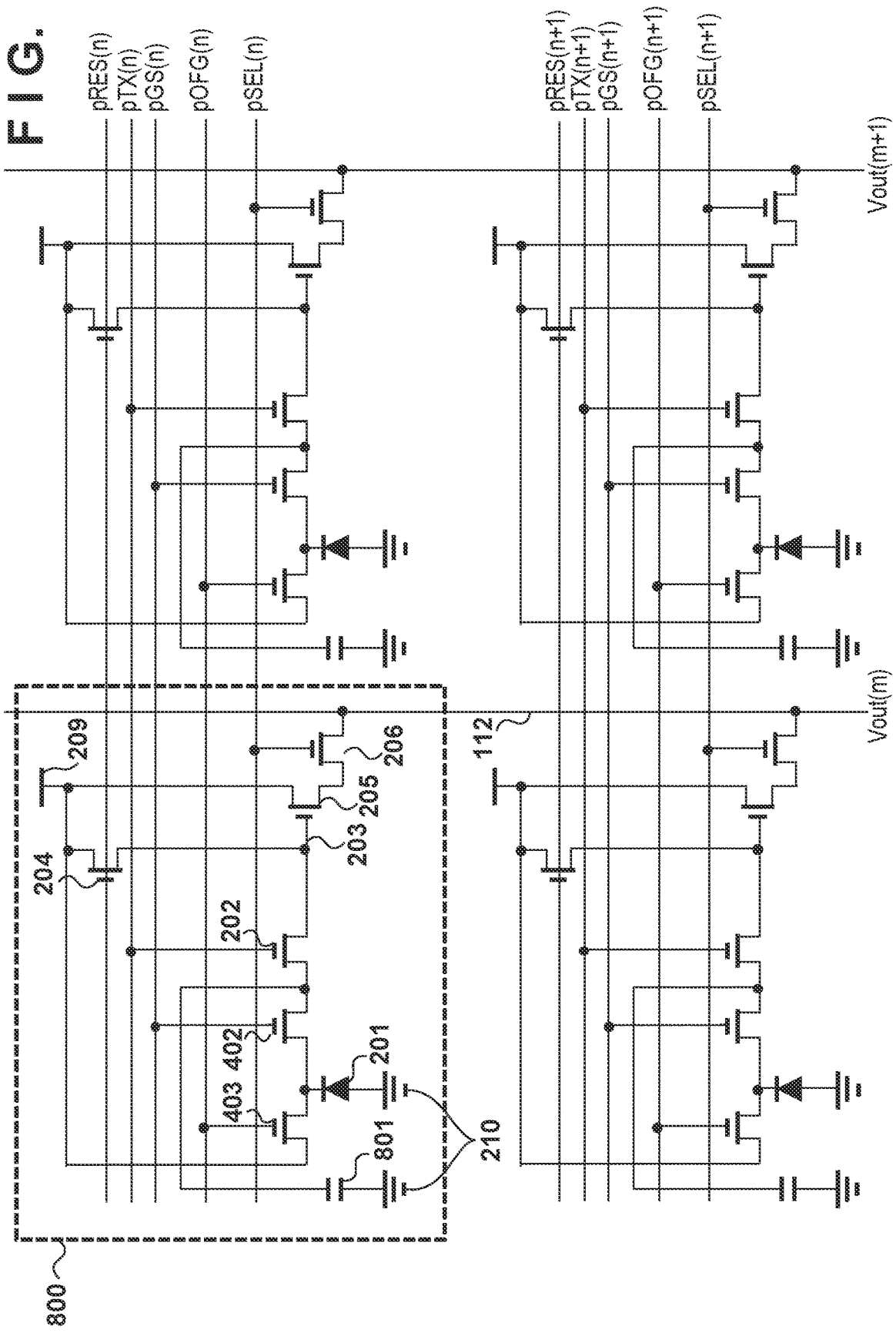
FIG. 8 is an equivalent circuit diagram illustrating a configuration of a pixel according to a fourth embodiment of the present invention.

A fourth embodiment of the present invention will be described with reference to FIG. 8. The overall configuration of the imaging device is the same as that of the imaging device 100 in FIG. 1. In the present embodiment, a pixel circuit 800 illustrated in FIG. 8 is used as the pixel circuit 111 of the imaging device 100. FIG. 8 illustrates an equivalent circuit of the pixel circuit 800 according to the present embodiment. The differences between the pixel circuit 800 and the pixel circuit 400 in FIG. 4 will be mainly described below. The part the description of which is omitted may be similar to the pixel circuit 400. The imaging device 100 of the present embodiment is a back-side illuminated imaging device.

The pixel circuit 800 does not include the capacitive element 208, the capacitive element 401, and the capacitive connection transistor 207 as compared with the pixel circuit 400 and includes a capacitive element 801. The capacitive element 801 is connected to a node between the global transfer transistor 402 and the transfer transistor 202. The capacitive element 801, instead of the capacitive element 401, holds the charge from the PD 201. That is, in the first to third embodiments, the capacitive element connected to the FD 203 has been described as an example, but as described in the present embodiment, the present invention can be applied to a capacitive element not connected to the FD 203.

The cross-sectional structure of the capacitive element 801 is similar to that of the capacitive element 208 illustrated in FIG. 3. By setting the transfer destination of the global transfer transistor 402 as the capacitive element 801, a global shutter function can be realized in the back-side illuminated imaging device.

Manufacturing Method

A method of manufacturing the imaging device 100 according to the first embodiment will be described with reference to FIGS. 9A to 9G The imaging devices according to the other embodiments can be manufactured in the same manner.

Figure 9A:
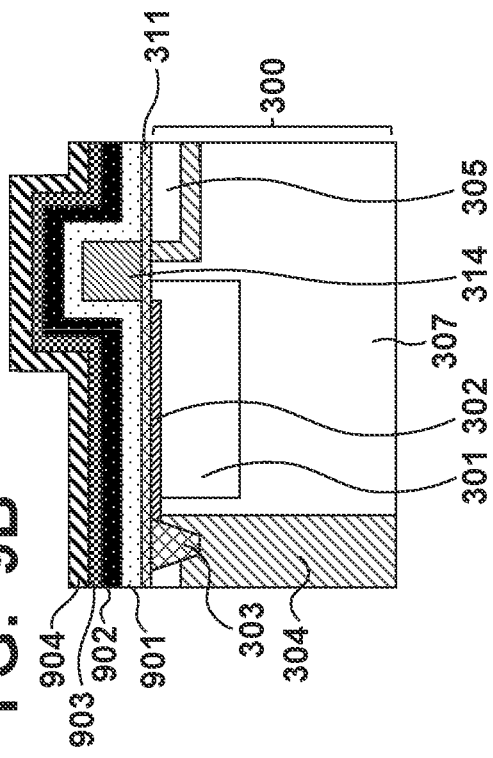

First, a structure illustrated in FIG. 9A is formed. Specifically, a substrate 300 including each of the regions illustrated in FIG. 3 is formed using a CMOS/LSI process. The gate insulating film 311, each gate electrode including the gate electrode 314, and an insulating film 901 are formed over the substrate 300. The insulating film 901 is formed by plasma CVD or the like and is, for example, an $SiO_2$ film or a SiN film.

Figure 9B:
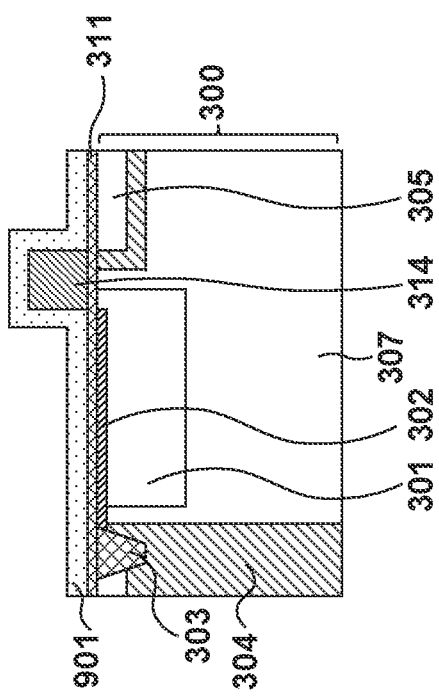

Subsequently, a structure illustrated in FIG. 9B is formed. Specifically, a metal film 902, an insulating film 903 and a metal film 904 are formed in this order on the insulating film 901 by a CVD method, a sputtering method, or the like. A material of the metal film 902 is titanium nitride (TiN), tungsten (W), aluminum (Al), or the like. A material of the insulating film 903 is $SiO_2$, SIN, a high dielectric constant member (High-κ member), or the like. A material of the metal film 904 is titanium nitride (TiN), tungsten (W) film, aluminum (Al), or the like.

Figure 9C:
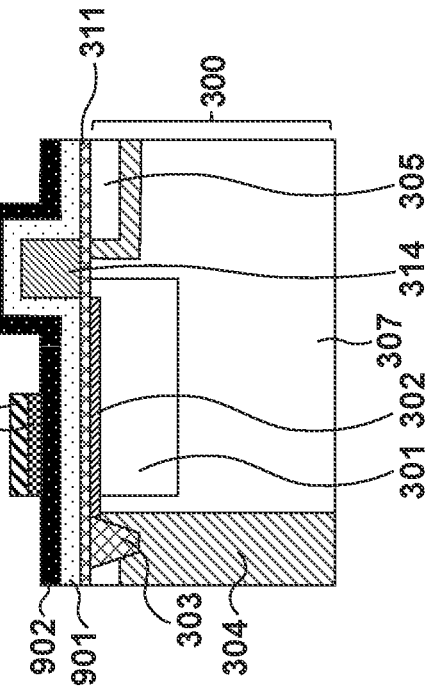

Subsequently, as illustrated in FIG. 9C, a resist mask 905 is formed on the metal film 904 by using a resist coating technique, a lithography technique, or the like. The resist mask 905 exposes a portion of the metal film 904 to be removed and covers the other portion.

Figure 9D:
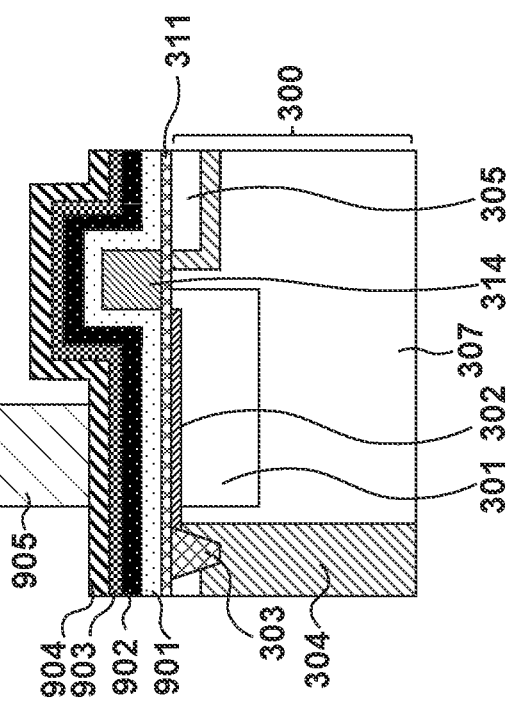

Subsequently, as illustrated in FIG. 9D, portions of the metal film 904 and the insulating film 903 which are not covered by the resist mask 905 are removed by using a reactive ion etching method (RIE) or the like. The remaining portion of the metal film 904 becomes the upper metal electrode 318. The remaining portion of the insulating film 903 becomes the capacitive insulating film 317.

Subsequently, as illustrated in FIG. 9E, a resist mask 906 is formed on the metal film 902 using a resist coating technique, a lithography technique, or the like. The resist mask 906 exposes a portion of the metal film 902 to be removed and covers the other portion.

Subsequently, as illustrated in FIG. 9F, a portion of the metal film 902 not covered with the resist mask 906 is removed using reactive ion etching method (RIE) or the like. The remaining portion of the metal film 902 becomes the lower metal electrode 316.

Next, as illustrated in FIG. 9G the insulating layer 312 is formed using a plasma CVD method or the like, the top surface of the insulating layer 312 is leveled using CMP or the like, and contact plugs including the contact plug 319, 320 are produced. The contact plug is formed by forming a contact hole penetrating the insulating layer 312 using an etching method or the like; and then embedding titanium nitride (TiN), tungsten (W) or the like in the contact hole. When contact holes are formed at the same timing with respect to the surface of the substrate 300 and the metal electrode surface, there is a concern of white flaws due to metal scattering. Therefore, the contact holes for the surface of the substrate 300 and the contact holes for the metal electrode surface may be formed at different timings by etching or the like.

Subsequently, the wiring layer 313 is formed using a normal CMOS/LSI process, and the other components are formed so that the imaging device 100 of FIG. 3 is manufactured. A material of the wiring layer 313 is, for example, an alloy such as copper (Cu), aluminum (Al).

Modification Example

Figure 10A:
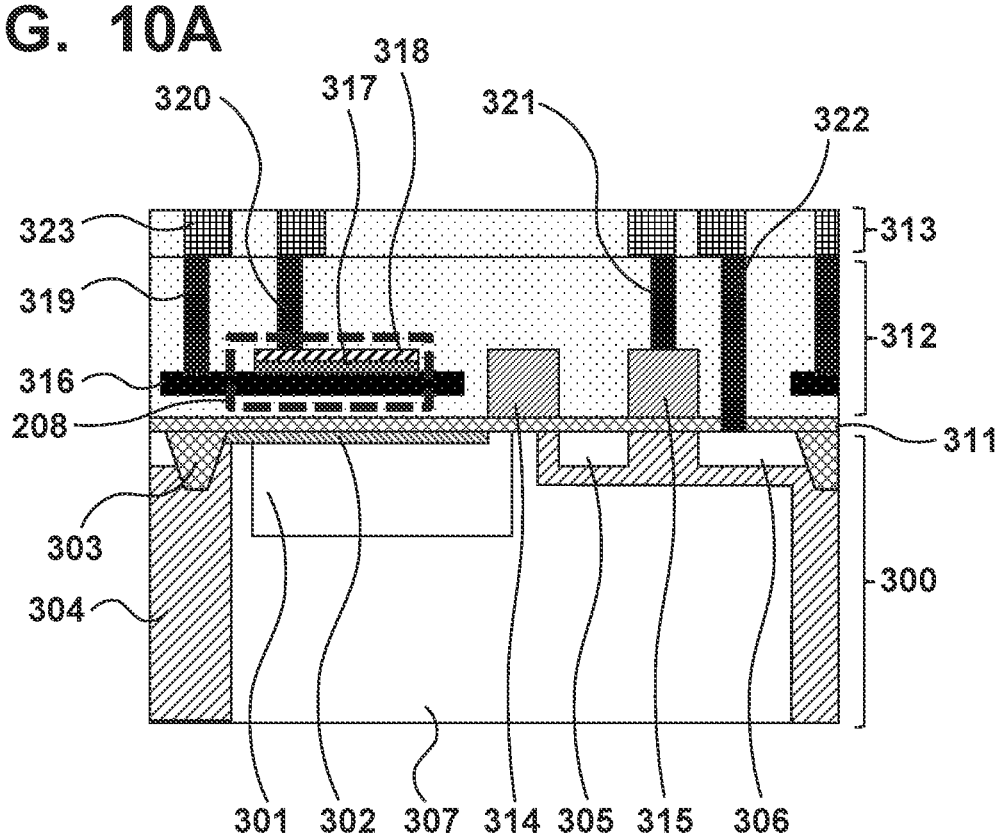
FIGS. 10A and 10B are cross-sectional schematic diagrams illustrating a modified example of the configuration of the pixel according to the first embodiment of the present invention.

A modification example of the imaging device 100 according to the first embodiment will be described with reference to FIGS. 10A and 10B. Similar modifications may be made to the imaging devices according to the other embodiments.

In the example of FIG. 3, the lower metal electrode 316 has a step along the gate electrode 314. Instead as illustrated in FIG. 10A, the lower metal electrode 316 may be flat. In the process of FIG. 9C described above, residues of the insulating film 903 and the metal film 904 may be generated on a part of the side surfaces of the gate electrode 314. In the shape of the lower metal electrode 316 illustrated in FIG. 10A, even the residues of the insulating film 903 and the metal film 904 are removed by etching in the process of FIG. 9E described above. Thus, a leak current in the capacitive element 208 is suppressed.

Figure 10B:
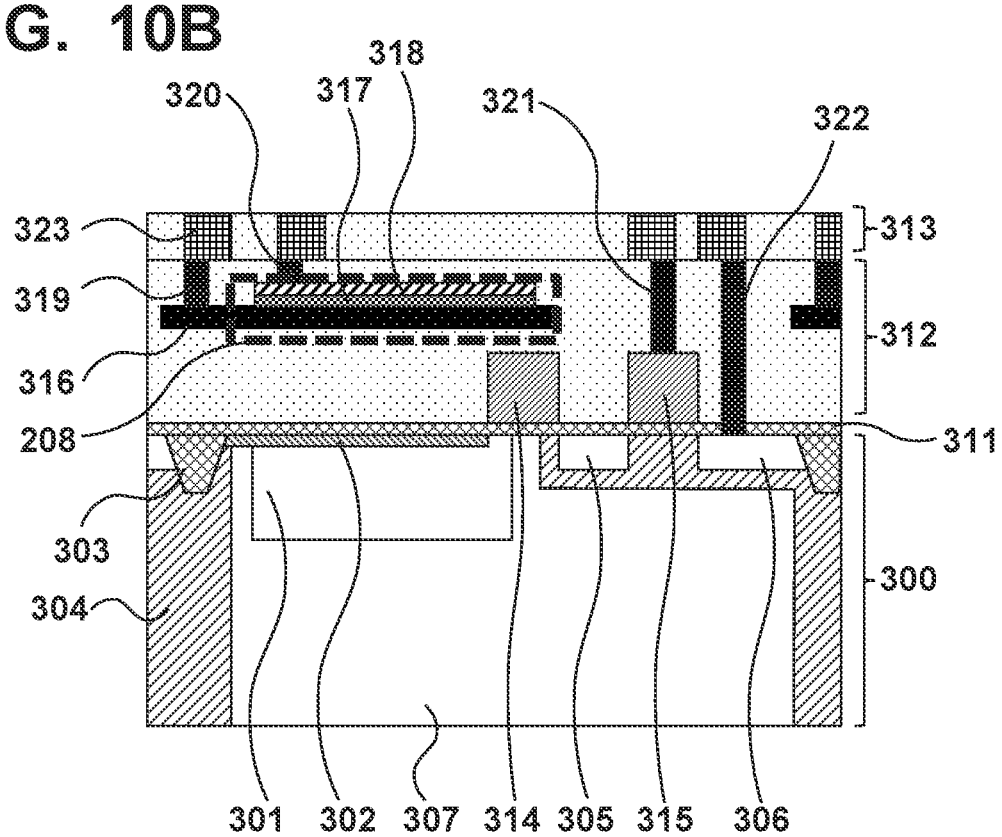

In the example of FIG. 10B, the lower metal electrode 316 is flat and extends above the gate electrode 314. Such a structure is formed in the process of FIG. 9A described above by forming the insulating film 901 such that the thickness of the insulating film 901 is greater than that of the gate electrode 314 and leveling the top surface of the insulating film 901. In this structure, the etching residue of the insulating film 903 and the metal film 904 may not be concerned.

OTHER EMBODIMENTS

Hereinafter, as an application example of the imaging device according to each of the above-described embodiments, a camera in which the imaging device is incorporated will be exemplarily described. The concept of a camera includes not only an apparatus the main purpose of which is imaging, but also an apparatus (for example, a personal computer, a mobile terminal, a car, etc.) which has an imaging function supplementarily. Also, the camera may be, for example, a module component such as a camera head. The camera includes the imaging device according to the present invention exemplified as the above embodiment, and a signal processing unit that processes a signal output from the imaging device. The signal processing unit may include, for example, a processor that processes digital data based on a signal obtained from the imaging device. The A/D converter for generating the digital data may be provided on a semiconductor substrate of the imaging device or may be provided on another semiconductor substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-165429, filed Sep. 4, 2018, which is hereby incorporated by reference herein in its entirety.

What is claimed is:

1. A back-side illuminated imaging device comprising:
a substrate including a first photoelectric conversion region and a second photoelectric conversion region;
a contact plug connecting a wiring layer and the substrate; and
a capacitive element including a first metal electrode and a single second metal electrode disposed between the first metal electrode and the substrate,
wherein a distance between the second metal electrode and the substrate is shorter than a length of the contact plug, and
wherein the single second metal electrode extends from a position overlapping at least a portion of the first photoelectric conversion region to a position overlapping at least a portion of the second photoelectric conversion region in a planar view with respect to a main surface of the substrate.

2. The imaging device according to claim 1, wherein the substrate further includes a floating diffusion configured to convert charge generated in the first photoelectric conversion region into a voltage, and
wherein the capacitive element is electrically connected to a signal path from the first photoelectric conversion region to the floating diffusion.

3. The imaging device according to claim 2, wherein the capacitive element is connected to the floating diffusion via a switch element.

4. The imaging device according to claim 2, wherein the imaging device comprises two transistors in the signal path from the first photoelectric conversion region to the floating diffusion, and
wherein the capacitive element is connected to a node between the two transistors.

5. The imaging device according to claim 4, wherein the substrate further includes an impurity region,
wherein the two transistors include a first transistor configured to transfer charge from the first photoelectric conversion region to the impurity region and a second transistor configured to transfer charge from the impurity region to the floating diffusion, and
wherein the second metal electrode overlaps at least a part of the impurity region in a planar view with respect to the main surface of the substrate.

6. The imaging device according to claim 1, wherein a distance between the first metal electrode and the substrate is shorter than a length of the contact plug.

7. The imaging device according to claim 1, wherein the second metal electrode overlaps an entire surface of the first photoelectric conversion region in a planar view with respect to the main surface of the substrate.

8. The imaging device according to claim 1, wherein charge generated in each of the first photoelectric conversion region and the second photoelectric conversion region is converted into a voltage by a common floating diffusion.

9. The imaging device according to claim 1, wherein the first metal electrode extends from a position overlapping at least a portion of the first photoelectric conversion region to a position overlapping at least a portion of the second photoelectric conversion region in a planar view with respect to the main surface of the substrate.

10. The imaging device according to claim 1, further comprising:
an insulating layer located between the substrate and the wiring layer; and
a capacitive insulating film located between the first metal electrode and the second metal electrode and having a dielectric constant higher than the insulating layer.

11. The imaging device according to claim 1, wherein the second metal electrode is connected to a region of the substrate to which a ground voltage is supplied.

12. A camera comprising:
   the imaging device according to claim 1; and
   a processing unit configured to process a signal output from the imaging device.

13. The imaging device according to claim 1, wherein the first metal electrode of the capacitive element is a single first metal electrode extending from a position overlapping at least a portion of the first photoelectric conversion region to a position overlapping at least a portion of the second photoelectric conversion region in a planar view with respect to the main surface of the substrate.

14. The imaging device according to claim 13, wherein the contact plug connecting the wiring layer and the substrate is a first contact plug,
   wherein the imaging device further comprises a second contact plug connecting the single first metal electrode and the wiring layer, and
   wherein the second contact plug is located between the first photoelectric conversion region and the second photoelectric conversion region in a planar view with respect to the main surface of the substrate.

15. A method of manufacturing an imaging device, the method comprising:
   forming at least one metal electrode of a capacitive element above a substrate, the substrate including a first photoelectric conversion region and a second photoelectric conversion region, the at least one metal electrode of the capacitive element including a single metal electrode extending from a position overlapping at least a portion of the first photoelectric conversion region to a position overlapping at least a portion of the second photoelectric conversion region in a planar view with respect to a main surface of the substrate;
   forming an insulating layer above the substrate and the at least one metal electrode;
   forming a contact plug through the insulating layer; and
   forming a wiring layer above the insulating layer and the contact plug.

* * * * *